United States Patent [19]
Garcia, Jr.

[11] Patent Number: 4,641,026
[45] Date of Patent: Feb. 3, 1987

[54] OPTICALLY ACTIVATED KEYBOARD FOR DIGITAL SYSTEM

[75] Inventor: Felix Garcia, Jr., Round Rock, Tex.

[73] Assignee: Texas Instruments Incorporated, Dallas, Tex.

[21] Appl. No.: 576,225

[22] Filed: Feb. 2, 1984

[51] Int. Cl.$^4$ .............................................. G01D 5/34
[52] U.S. Cl. .................... 250/229; 340/365 P
[58] Field of Search ............... 340/365 P; 250/227, 250/229, 221

[56] References Cited

U.S. PATENT DOCUMENTS

| | | | |
|---|---|---|---|
| 3,603,982 | 9/1971 | Patti ................................. | 340/365 P |
| 3,648,050 | 3/1972 | Koo ................................ | 340/365 P |
| 3,856,127 | 12/1974 | Halfon et al. ...................... | 250/221 |
| 4,379,968 | 4/1983 | Ely et al. ............................ | 250/229 |
| 4,442,425 | 4/1984 | Eibner ............................... | 340/365 P |

FOREIGN PATENT DOCUMENTS 0004520  3/1979  European Pat. Off. .

*Primary Examiner*—David C. Nelms
*Attorney, Agent, or Firm*—Thomas G. Devine; Leo N. Heiting; Melvin Sharp

[57] ABSTRACT

An optically activated keyboard provides inputs to a digital computer or the like. The keyboard includes a key housing having formed therein a wave guide matrix of intersecting columns and rows with light emitting diodes (LED's) installed in one end of each column and photo transistors installed in one end of each row. A plurality of keys are mounted at the top surface of the housing, each key having a plunger which projects through a corresponding aperture in the housing, when the key is depressed. The intersections of the columns and rows are located directly beneath the apertures so that when a key is depressed, its plunger intrudes into the volume at the intersection. Each plunger, in concert with the wave guide intersection, forms a light polarizing system. In the preferred embodiment, each plunger has a reflecting face that is angled to reflect light from the LED in the corresponding column into the corresponding row, finally impinging against the appropriate photo transistor. In this preferred embodiment, when the button is fully depressed, the plunger provides space between the bottom of the plunger and the bottom of the wave guide so that light traveling in the column or row is permitted to pass and thereby to detect any other keys that have been depressed in the particular column or row.

13 Claims, 8 Drawing Figures

OPTICALLY ACTIVATED KEYBOARD FOR DIGITAL SYSTEM

BACKGROUND OF THE INVENTION

1. Field of the Invention

This invention relates to a manual input keyboard for digital systems. More specifically, it refers to digital systems having a manual input keyboard that is optically activated.

2. Description of the Prior Art

In the past, typical keyboards for use in digital systems have employed contact switches for making electrical circuits. The circuit continuity identifies a particular key that has been depressed. Reed switches have been employed and in more recent time, Hall Effect sensor have been employed.

Optical keyboards have been employed in the prior art. These prior art optical keyboards involve a plurality of columns, each having an LED at one end and a photo transistor at the other, and a plutality of intersecting rows, also with an LED and photo transistor at the ends. Keys are located at the intersections of these columns and rows and when a key is depressed, both the column and row light is interrupted and the appropriate photo transistors are turned off. In this manner, a depressed key is located.

Still another prior art optical keyboard involves less than a one for one relationship between light emitters and light detectors to reduce the number of components required.

In the present invention however, blocking light is not done. Instead, a reflection of light is employed to contact a photo transistor and thereby to increase its signal output.

BRIEF SUMMARY OF THE INVENTION

This invention involves an optical keyboard with a wave guide matrix formed in its housing. A wave guide matrix is made up of columns and intersecting rows. In this preferred embodiment, LED's are positioned at one end of each of the columns. Photo transistors are positioned at one end of each of the rows. There is an aperture formed above each intersection in the housing surface. Key assemblies are positioned above the apertures, each key assembly having a plunger that passes through the aperture into the intersection of the wave guide column and row. A guide is set into the aperture and contoured to prevent rotation of the plunger.

The LED's are sequentially turned on and off by a scanning microprocessor. Since the identification of the activated LED is known and since the affected photo transistor is detected by a resultant signal, the depressed key is identifiable. The depressed key has a plunger which, in this preferred embodiment, intrudes into the wave guide intersection a limited distance. It has a reflective surface that is inclined at a desired angle to reflect light from the LED in its column to the photo transistor in its row. Additionally, light from its LED continues transmission through the column, below the plunger. If another plunger is depressed at the same time, the transmitted light is reflected from that plunger's reflecting surface to the appropriate photo transistor. The first key depressed is the first key read. Also, if a key has been depressed in its row, the reflected light continues transmission in the row. If the keys were depressed at precisely the same moment, the problem of which key should be recognized is logically accomplished.

In another embodiment of this invention, the LED's and photo transistors are located at the data handling apparatus such as a digital computer. They are then connected to the appropriate columns and rows through optical fibers, thereby providing a keyboard that is non-electronic.

The advantage of this keyboard over the prior art keyboards is that it is insensitive to electromagnetic and radio-frequency interference, eliminates combustion or sparks caused by short circuits or making and breaking of contacts, has low transmission loss and wide transmission bandwidth. It is advantageous over any prior art optical systems because of its simplicity of design and resultant low cost and reliability.

The principal object of this invention is to provide a digital system having an input keyboard that is simple in structure and insensitive to electromagnetic and radio-frequency interference.

Another object of this invention is to provide a keyboard that requires no electrical input and therefore may be isolated in a hostile environment.

Still another object of this invention is to provide a keyboard that has low transmission loss and wide transmission bandwith. These and other objects will be made evident in the detailed description that follows.

DETAILED DESCRIPTION OF THE INVENTION

Figure 1:
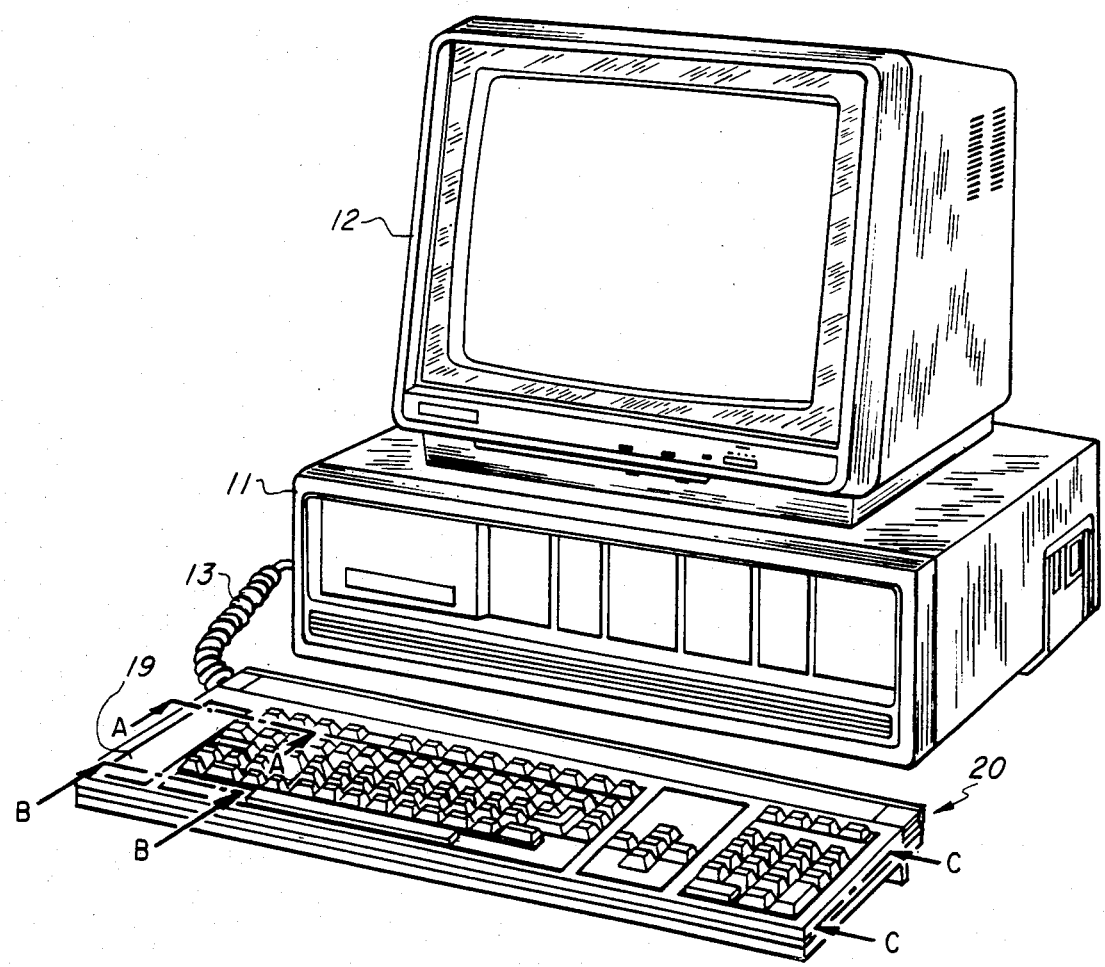
FIG. 1 is a perspective view of the digital system of this invention.

In FIG. 1, computer 11 having display 12 is connected electrically (or optically) through cord 13 to optionally activated keyboard 20. Computer 11 and display 12 may be any of the personal computers available, such as the Professional Computer of Texas Instruments Incorporated. A personal computer is shown, but any terminal or other computer, with appropriate interfacing, could be connected to the manual input keyboard device 20 of this invention.

Figure 2:
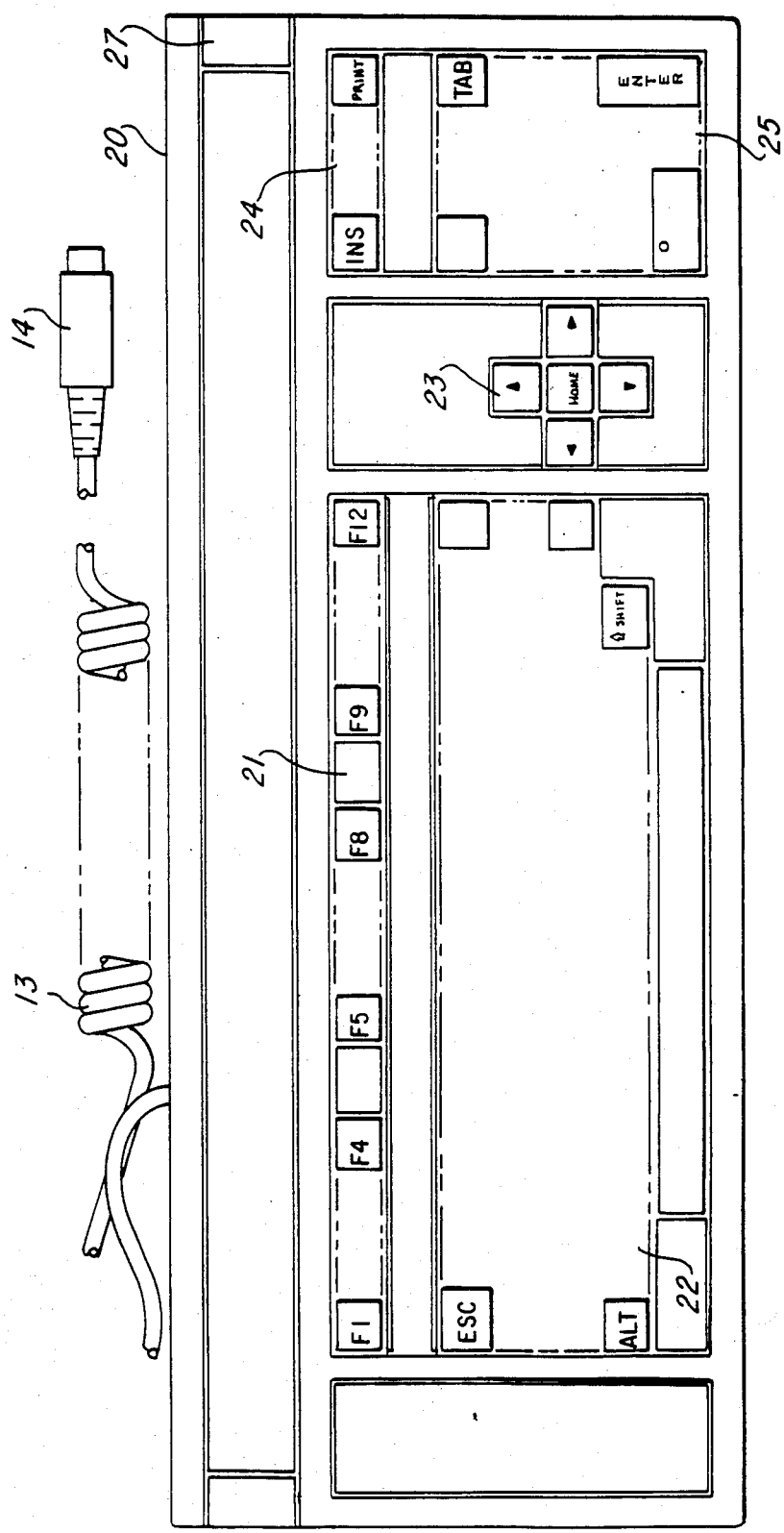
FIG. 2 is a top view of the optical keyboard device of this invention equipped with an electrical cord connection.

FIG. 2 is a top view of the optically activated keyboard 20 illustrating keyboard sections 21, 22, 23, 24, and 25. All of the keys are not shown for purposes for clarity. Electrical cord 13' is shown having connector 14. Connector 14 is an electrical connector for making electrical connections within the computer 11.

Figure 3:
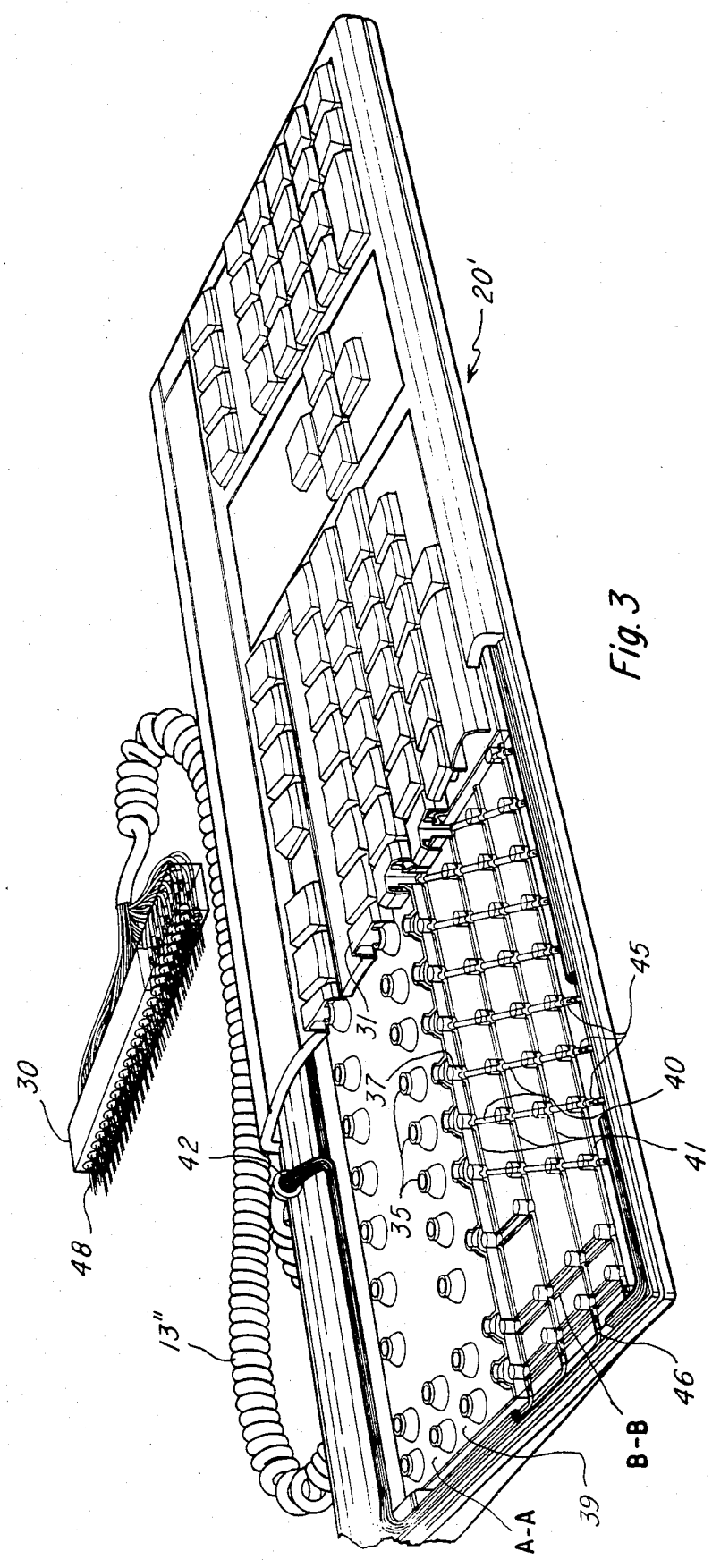
FIG. 3 is a twice sectioned (A—A and B—B of FIG. 1) perspective view of the keyboard of this invention equipped with an optical connection.

FIG. 3 illustrates optically activated keyboard 20' illustrating sections A—A and B—B. In section A—A, rubber dome 35 is shown fitting over guide 37. Key cap 31 fits over rubber dome 35 and plunger 32 (see FIG. 6) passes through dome 35 and guide 37 when key cap 31 is pressed.

In section B—B, wave guide columns 40 and wave guide rows 41 are shown. They are formed in housing 39. Cord 13", contains optical fibers 42 that are connected to the columns and rows for transmitting light from the LED's and for transmitting light to the photo transistors. The LED's and the photo transistors are housed in assembly 30 having electrical contacts 48 for connection to computer 11.

The optical fibers 42 for transmitting light from the LED's are shown connected to the columns 40 through a lens connection 45. The optical fibers for transmitting light from the photo transistors are shown connected through lens 46 to the rows 41. In FIG. 1, section 19 is shown without keys. In FIG. 3, that section is shown with a facility for adding keys.

Figures 4, 5:
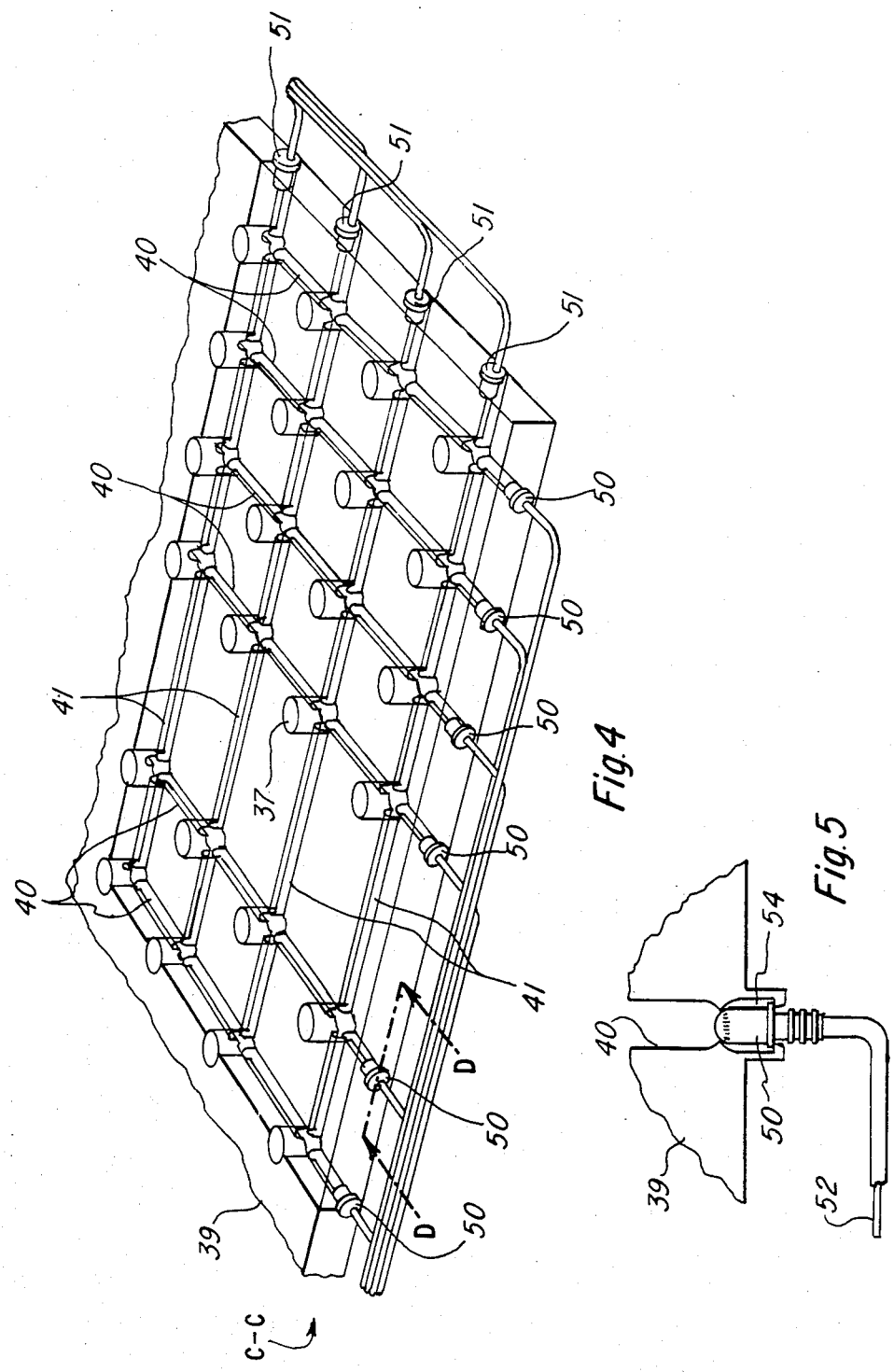
FIG. 4 is a perspective section (C—C of FIG. 1) of the keyboard of this invention.
FIG. 5 is a cross-sectional view (D—D of FIG. 4) illustrating a light source at a waveguide.

FIG. 4 illustrates a section C—C in the housing 39 to more clearly illustrate the wave guide matrix made up of columns 40 and rows 41 formed in housing 39. In this preferred embodiment, housing 39 is a plastic material in which the columns 40 and rows 41 have been formed in the molding procedure by which the housing 39 was made. In this preferred embodiment, the plastic material is Polycarbonate with a refractive index of 1.5 microns at a wavelength of 0.651 microns. These columns and rows could also be formed by machining, such as milling, and then polishing. Guide 37 is shown throught which the key plunger 32 (see FIG. 6) passes. In this preferred embodiment, the LED's 50 shown in place in columns 40, are Texas Instruments Type TIL903-1. The photo transistors 51 shown in place in the rows 41 are Texas Instruments Type TIL-414. Both the LED and photo transistor are arbitrary choices and many suitable substitutes may be found. In this particular embodiment, infrared light is employed, but visible light and higher frequency light could be employed as well.

FIG. 5 is a sectional view D—D taken as shown in FIG. 4 illustrating LED 50 positioned in recess 54 to enable light to pass into column 40, formed in housing 39. Electrical conductors 52 ultimately are packaged in cord 13' for electrical connection to the computer 11. FIGS. 4 and 5 would be virtually unchanged in the configuration where optical fibers are brought in and connected to the columns 40 and rows 41 form remote LED's and photo transistors.

It should be noted that columns 40 could have photo transistors 51 in place and rows 41 could have LED's 50 in place. That is to say, there can be a total reversal of the pattern of the preferred embodiment shown.

Figure 6:
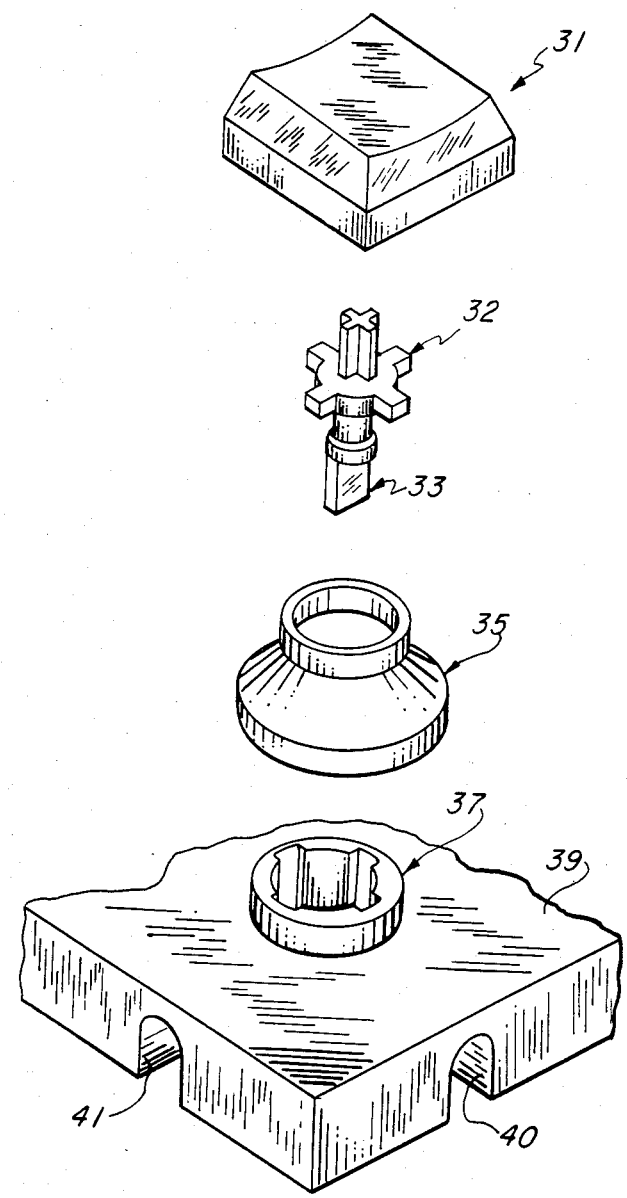
FIG. 6 is an exploded view of the key assembly and guide of the keyboard of this invention.

FIG. 6 illustrates key cap 31 which fits on plunger 32, plunger 32 passing through rubber dome 35 and guide 37 set in housing 39. A configuration of plunger 32 fits into a corresponding configuration in guide 37 to prevent rotation of plunger 32. Column 40 and row 41 are shown in housing 39.

Reflective surface 33 is shown formed in plunger 32 at an angle appropriate to reflect light from a column into a row. The angle depends on the material of which the plunger is made and the frequency of light. In this preferred embodiment, infrared light is employed and the angle is approximately 45 degrees. Rubber dome 35 provides resiliency so that when key cap 31 is released, dome 35 forces key cap 31 and plunger 32 back to the up position. A spring suitably positioned could also be used for this purpose.

In the preferred embodiment, the plunger 32 is made of Polycarbonate, the same material as housing 39. This material, properly dimensioned, permits light to pass through as well as to be reflected. This is an engineering design choice and other materials may be used as well.

MODE OF OPERATION

Figure 7:
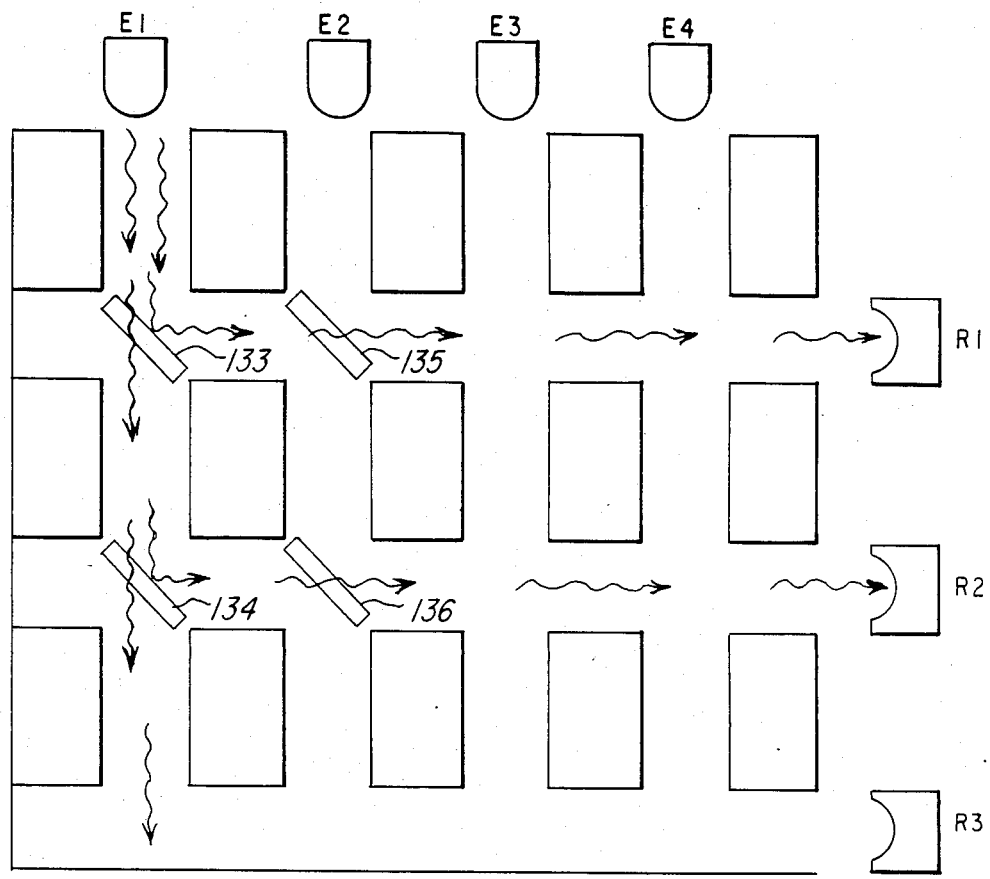
FIG. 7 is a schematic diagram illustrating the effect of four keys being depressed at the same time.

FIG. 7 is a schematic diagram illustrating the emission of light from the emitters E1-E4 to the receivers R1-R3. Emitter E1 (in this preferred embodiment an LED) is shown emitting light into column 140. The light is reflected by a selected key which causes reflecting surface 133 to intrude into the light guide. Some of the light passes reflective surface 133 to reflective surface 134 from another key that has been depressed. Some of the light reflects from surface 134 and some of the light passes through. The light reflected from surface 133 passes to reflective surface 135 from still another depressed key. The light passes reflective surface 135 and impinges against receiver R1 (photo transistors in this preferred embodiment). Light reflected by surface 134 passes to reflective surface 136 from still another depressed button and continues to receiver R2. In this example, the keys for reflective surfaces 133 and 134 are both detected at receivers R1 and R2. The first of the keys depressed provides the first signal. When two or more keys are pressed at precisely the same moment, an arbitrary logic decision is made.

The keys with surfaces 135 and 136 were also depressed. However, their associated emitter E2 has not been activated. The emitters are activated by scanning, as indicated earlier. In this preferred embodiment, the electronics of the Texas Instruments 940 terminal keyboard is used. More specifically, a Texas Instruments 3870 microcomputer performs the scanning. The microcomputer is connected to each of the LED's to sequentially activate them. This is a conventional scanning technique and need not be described in detail here. When emitter E2 is activated by the scanning procedure, then the keys corresponding to reflecting surfaces 135 and 136 are detected in a like manner. This facility for reflection and transmission overcome the "phantom key" or N-key roll-over keyboard problem where a depressed key "hides" another depressed key.

Figure 8:
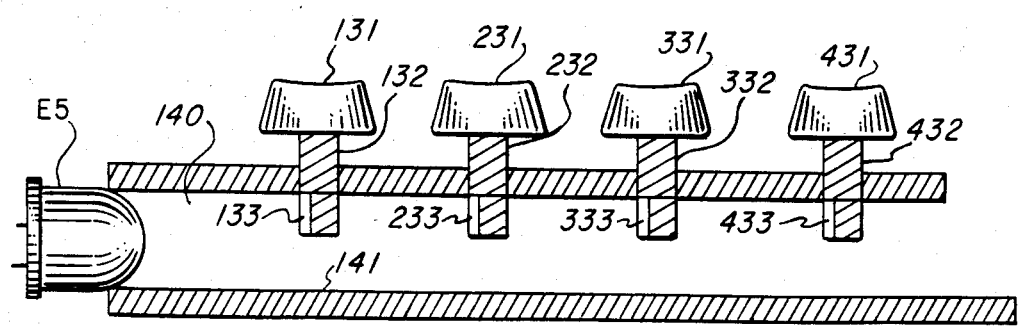
FIG. 8 is a cross-sectional view of four keys being depressed at the same time.

FIG. 8 is a cross-section of column 140 showing an emitter E5 in position with key caps 131-431 all depressed, causing plungers 132-432 to intrude into the light guide as indicated. Reflective surfaces 133-433 are shown for reflecting and passing light from emitter E5.

As indicated, in this preferred embodiment, light is not only reflected, but passed by the material employed in plungers 132-432. With the proper selection of materials, the plungers could extend to the bottom surface 141 of column 140. This configuration requires material that not only reflects light into the appropriate row, but also permits light to pass in the column 140. In this preferred embodiment, however, the light wave column 140 is approximately 0.190 inches in diameters, and plungers 132-432 are permitted to intrude a distance of approximately 0.06 inches, thereby leaving a distance of approximately 0.130 inches between surface 141 and the bottom of plungers 132-432. Such a structure permits light to pass below the plungers as well as through the plungers, and also to be reflected by reflecting surfaces 133-433.

Plungers may be made of materials that do not pass light but are simply reflective. For example, in another embodiment, aluminum is used and reflective surfaces 133-433 are polished to a number 4L microfinish.

The plungers may be made of other opaque materials and appropriately reflective materials affixed to them to form the reflecting surfaces 133-433. However, when the plungers are designed to contact the bottom surface 141, then polarizing materials are required for reflection and a transmission of light.

It is contemplated that other light sources and LED's may be employed in this invention. For example, it is certainly contemplated that a laser could be employed. Also, various types of photo detectors are contemplated other than photo transistors. The wave guides forming the matrix in this invention may be formed of various types of light guiding materials. For example, fiber optics may be employed in grooves to serve as the columns and rows. Grooves may be lined with appropriate material to form the light guide. These and other changes are obvious and this invention is limited only by the scope of the appended claims.

I claim:

1. Manual input apparatus having scanning means, for providing inputs to data handling apparatus, comprising:
   (a) key housing means having a matrix of apertures formed through the top surface thereof;
   (b) wave guide means formed in the key housing means in a matrix configuration of columns and rows with the intersections of the columns and rows aligned below the apertures;
   (c) light source means connected to each column, each light source means being turned on and off in a predetermined order by the scanning means;
   (d) light detecting means connected to each row, activated by impinging light to provide a signal indicative of detection;
   (e) key means resiliently mounted over each aperture and having a plunger for passing through the aperture when a key means is selected and depressed; and
   (f) polarizing means formed by each plunger to reflect light, from a light source means that is turned on at a scanned column when the key means has been depressed, through the row at that intersection to the light detecting means associated with that row wherein each plunger is dimensioned so that when the associated key means is depressed, the plunger intrudes into the wave guide means a predetermined distance, defining a volume between the bottom of each plunger and the bottom of the wave guide means to permit light to pass through the volume in the scanned column to allow detection of other depressed keys in the scanned column and associated rows.

2. The apparatus of claim 1 further comprising optical fiber means for connecting each light source means to each column and for connecting each light detecting means to each row.

3. The apparatus of claim 1 wherein each plunger has a reflecting surface formed at a desired angle to the rows and columns to reflect light into the row at the intersection of a depressed key means.

4. The apparatus of claim 2 wherein each plunger has a reflecting surface formed at a desired angle to the rows and columns to reflect light into the row at the intersection of a depressed key means.

5. The apparatus of claim 3 wherein the light source means comprises a light emitting diode for each column and the light detecting means comprises a photo transistor for each row.

6. The apparatus of claim 4 wherein the light source means comprises a light emitting diode for each column and the light detecting means comprises a photo transistor for each row.

7. Digital apparatus comprising:
   (a) data handling means; and
   (b) manual input means operatively connected to supply input signals to the data handling means, the manual input means comprising:
   key housing means having a matrix of apertures formed through the top surface thereof,
   wave guide means formed in the key housing means in a matrix configuration of columns and rows with the intersections of the columns and rows aligned below the apertures,
   light source means connected to each column, each light source means being turned on and off in a predetermined order by the scanning means,
   light detecting means connected to each row, activated by impinging light to provide a signal indicative of detection;
   key means resiliently mounted over each aperture and each key means having a plunger for passing through the aperture when a key means is selected and depressed, and
   polarizing means formed by each plunger to reflect light, from a light source means that is turned on at a scanned column when the key means has been depressed, through the row at that intersection to the light detecting means associated with that row wherein each plunger is dimensioned so that when the associated key means is depressed, the plunger intrudes into the wave guide means a predetermined distance, defining a volume between the bottom of each plunger and the bottom of the wave guide means to permit light to pass through the volume in the scanned column to allow detection of other depressed keys in the scanned column and associated rows.

8. The apparatus of claim 7 further comprising optical fiber means for connecting each light source means to each column and for connecting each light detecting means to each row.

9. The apparatus of claim 7 wherein each plunger has a reflecting surface formed at a desired angle to the rows and columns to reflect light into the row at the intersection of a depressed key means.

10. The apparatus of claim 8 wherein each plunger has a reflecting surface formed at a desired angle to the rows and columns to reflect light into the row at the intersection of a depressed key means.

11. The apparatus of claim 9 wherein the light source means comprises a light emitting diode for each column and the light detecting means comprises a photo transistor for each row.

12. The apparatus of claim 10 wherein the light source means comprises a light emitting diode for each column and a light detecting means comprises a photo transistor for each row.

13. The apparatus of claim 7 wherein the data handling means comprises a digital computer.

* * * * *